(12) United States Patent
Sako (10) Patent No.: US 6,741,514 B2
(45) Date of Patent: May 25, 2004

(54) SEMICONDUCTOR MEMORY DEVICE AND METHOD OF CONTROLLING THE SAME

(75) Inventor: Atsumasa Sako, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/420,790

(22) Filed: Apr. 23, 2003

(65) Prior Publication Data

US 2003/0227808 A1 Dec. 11, 2003

Related U.S. Application Data

(63) Continuation of application No. PCT/JP00/07883, filed on Nov. 9, 2000.

(51) Int. Cl.$^7$ .................................................. G11C 1/00
(52) U.S. Cl. ....................................... 365/205; 365/226
(58) Field of Search .................................. 365/205, 226

(56) References Cited

U.S. PATENT DOCUMENTS 5,726,943 A * 3/1998 Yamagata et al. ........... 365/222

FOREIGN PATENT DOCUMENTS

| JP | 0506467 A | 3/1993 |
|---|---|---|
| JP | 09063271 A | 3/1997 |
| JP | 9-120675 | 5/1997 |
| JP | 10-269771 A | 10/1998 |
| JP | 10-302467 | 11/1998 |
| JP | 11-273357 | 10/1999 |
| JP | 2000-285676 | 10/2000 |

* cited by examiner

*Primary Examiner*—M. Tran
(74) *Attorney, Agent, or Firm*—Arent Fox PLLC

(57) ABSTRACT

A semiconductor memory device includes a memory cell array in which a plurality of memory cells for storing data are arranged, a sense amplifier for amplifying the data in the memory cell, a first power source, and a second power source lower than the first power source. In a first step, the sense amplifier receives power supply from the first power source to amplify the data in the memory cell. In a second step, the sense amplifier does not receive power supply either from the first power source or from the second power source. In a third step, the sense amplifier receives power supply from the second power source to amplify the data in the memory cell.

17 Claims, 11 Drawing Sheets

SEMICONDUCTOR MEMORY DEVICE AND METHOD OF CONTROLLING THE SAME

This nonprovisional application claims the benefit of International Application No. PCT/JP00/07883, filed Nov. 9, 2000. The disclosure of the prior application is hereby incorporated herein in its entirety by reference.

TECHNICAL FIELD

The present invention relates to a semiconductor memory device and a method of controlling the same, and particularly relates to a semiconductor memory device which needs a refresh operation and a method of controlling the same.

BACKGROUND ART

Figure 2:
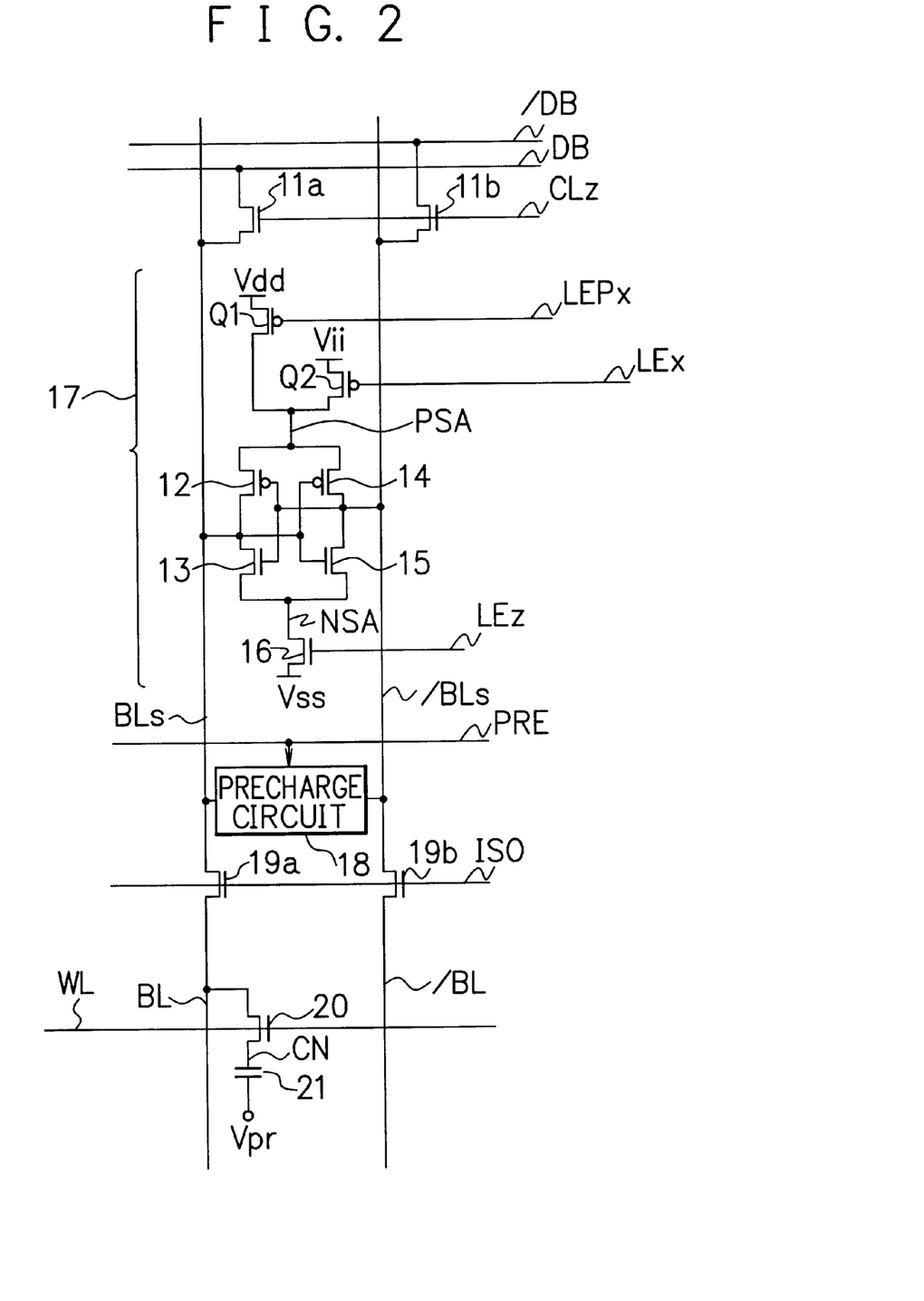
FIG. 2 is a circuit diagram of a memory cell to which a sense amplifier and a precharge circuit according to the first embodiment are connected.

As shown in FIG. 2, a semiconductor memory device such as a DRAM needs to perform a refresh operation in order to store data by accumulating electric charge in a capacitor element 21 in a memory cell and hold the electric charge. In this refresh operation, the potential of the capacitor element 21 in the memory cell is taken out to a bit line BL, and the potential difference between bit lines BL and /BL is amplified by a sense amplifier 17. Here, "/" means a bar indicating a logical inversion signal and hereinafter it is used in the same sense. To increase the speed of this amplification, the aforementioned amplification of potential difference is performed by the use of a first power source Vdd which is higher than a second power source Vii.

Figure 12:
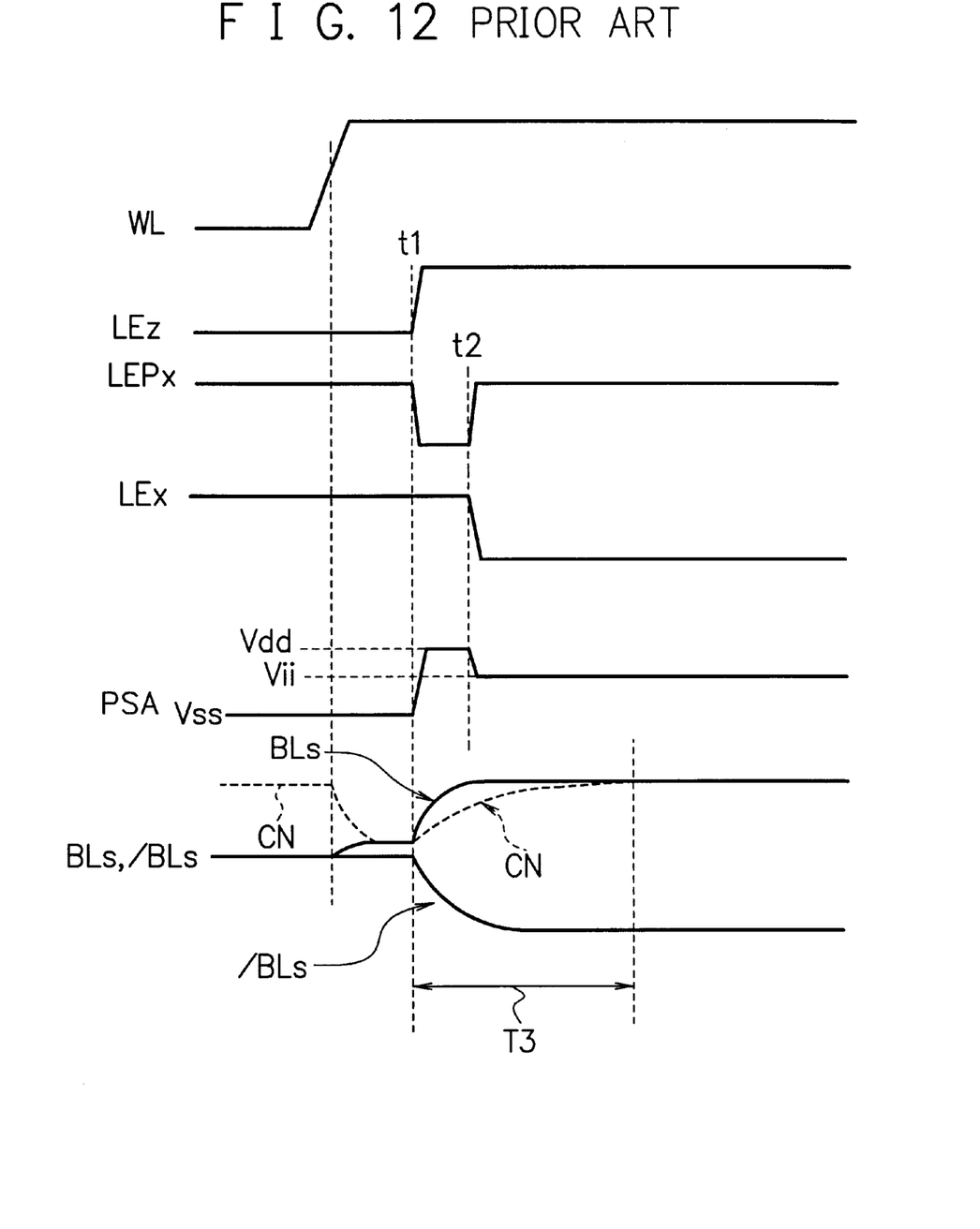
FIG. 12 is a timing chart for explaining a method of controlling a semiconductor memory device according to a prior art.

FIG. 12 is a timing chart showing a method of controlling a semiconductor memory device (DRAM) according to a prior art. When a word line WL is changed from a low level to a high level, a slight difference occurs between bit lines BL and BLs, and /BL and /BLs according to the electric charge accumulated in the capacitor element 21. The sense amplifier 17 amplifiers this potential difference after a timing t1.

Next, the control method at the timing t1 will be explained. By changing a second sense amplifier activating signal line LEz from a low level to a high level, an n-channel MOS transistor 16 (FIG. 2) is turned on. By changing an overdrive signal line LEPx from a high level to a low level, a p-channel MOS transistor Q1 is turned on. By maintaining a first sense amplifier activating signal line LEx at a high level, a p-channel MOS transistor Q2 remains off. Hence, a node PSA is connected to the first power source VDD, and a node NSA is connected to a potential Vss (ground). For example, the bit lines BL and BLs are amplified toward the potential of the first power source Vdd, and the bit lines /BL and /BLs are amplified toward the potential Vss.

Next, the control method at a timing t2 will be explained. By maintaining the second sense amplifier activating signal line LEz at the high level, the n-channel MOS transistor 16 remains on. By changing the overdrive signal line LEPx from the low level to the high level, the p-channel MOS transistor Q1 is turned off. By changing the first sense amplifier activating signal line LEx from the high level to a low level, the p-channel MOS transistor Q2 is turned on. Hence, the node PSA is connected to the second power source Vii, and the node NSA is connected to the potential Vss. For example, the bit lines BL and BLs are amplified toward the potential of the second power source Vii, and the bit lines /BL and /BLs are amplified toward the potential Vss.

The potential of a cell node (storage node) CN after t1 changes according to the potential of the bit line BLs. A data amplification time T3 is the time from the timing t1 until the potential of the cell node CN reaches the potential of the second power source Vii.

As described above, between the timings t1 and t2, the amplification is performed by the high power source Vdd, and after the timing t2, the amplification is performed by the low power source Vii. The aforementioned transient supply of the high power source Vdd to a sense amplifier is called overdrive, and this type of sense amplifier is called an overdrive sense amplifier. The data amplification time T3 can be shortened more by using two power sources Vdd and Vii than by using one power source Vii.

As shown in FIG. 12, the potential of the cell node CN after t1 changes later than the potential of the bit line BLs. To shorten the data amplification time T3, it is thought to raise the potential of the bit line BLs to a potential higher than the potential of the power source Vii for maintaining the potential of the memory cell. However, since the potential of the bit line BLs is thereafter stabilized at the potential of the power source Vii, it is required to switch the power source from Vdd to Vii. On this occasion, excess potential over the potential Vii of the bit line BLs needs to be extracted by the power source Vii. A current for extracting the excess potential is a wasteful current, and thus power consumption unnecessarily increases. Moreover, variations occur to the data amplification time T3 due to manufacturing variability in semiconductor memory devices or operating environment.

An object of the present invention is to provide a semiconductor memory device including a sense amplifier capable of amplifying data in a memory cell at high speed and with low power consumption and a method of controlling the same.

Another object of the present invention is to provide a semiconductor memory device including a sense amplifier capable of preventing variations in data amplification time due to manufacturing variability and a method of controlling the same.

Still another object of the present invention is to provide a semiconductor memory device including a sense amplifier capable of preventing variations in data amplification time due to changes in environment such as temperature and a method of controlling the same.

SUMMARY OF THE INVENTION

A semiconductor memory device of the present invention comprises a memory cell array in which a plurality of memory cells for storing data are arranged, a sense amplifier for amplifying the data in the memory cell, a first power source, and a second power source lower than the first power source. In a first step, the sense amplifier receives power supply from the first power source to amplify the data in the memory cell. In a second step, the sense amplifier does not receive power supply either from the first power source or from the second power source. In a third step, the sense amplifier receives power supply from the second power source to amplify the data in the memory cell.

By supplying the first high power source to the sense amplifier in the first step, the potential of a bit line connected to an output of the sense amplifier can be made higher than the potential of the second low power source, and hence the data in the memory cell can be amplified at high speed. By not supplying either the first power source or the second power source to the sense amplifier in the second step, the potential of the bit line, which is made higher than the potential of the second low power source, can be lowered by charging the cell and an end of the bit line, and hence power consumption can be reduced without electric power being consumed wastefully. By supplying the second low power source to the sense amplifier in the third step, the memory cell can be stabilized at a predetermined maintenance potential.

DETAILED DESCRIPTION OF THE PREFERRED EMBODIMENTS

Figure 1:
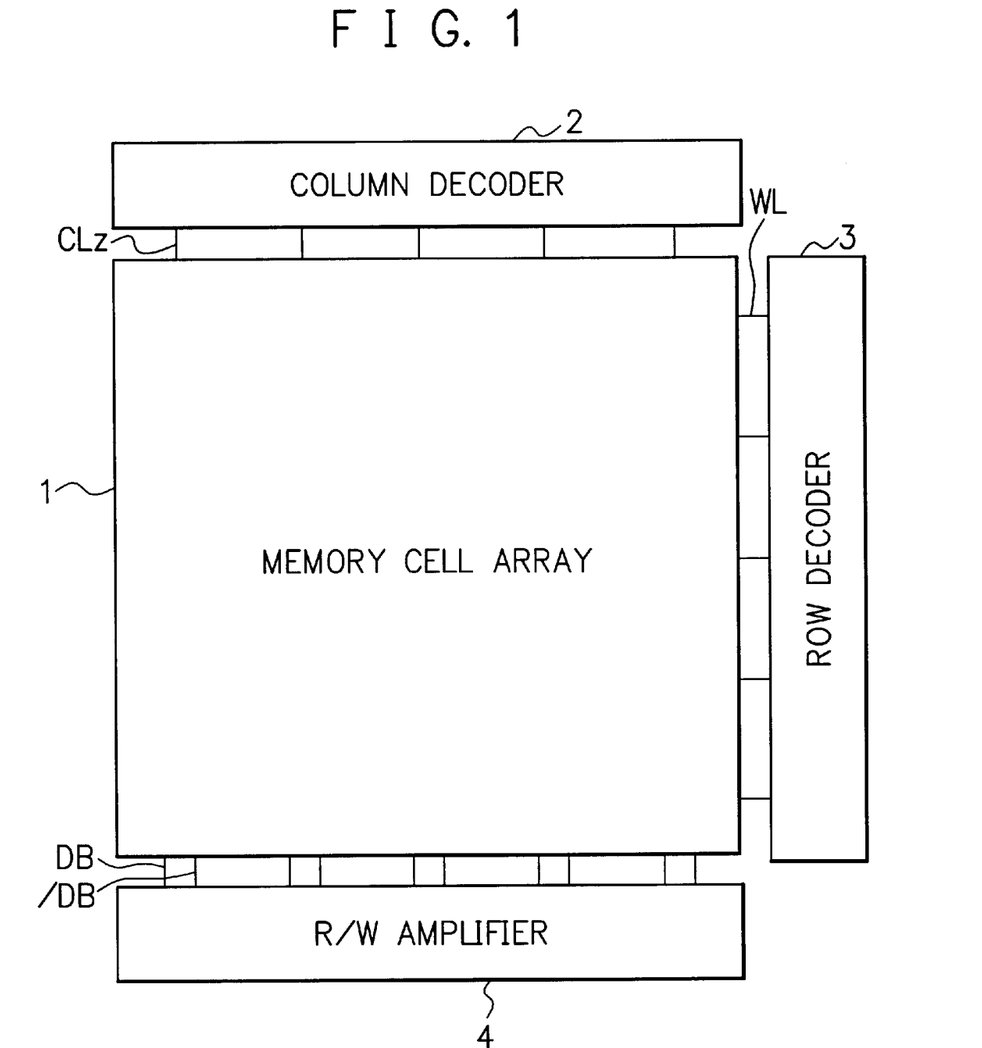
FIG. 1 is a block diagram showing the configuration of a semiconductor memory device according to a first embodiment of the present invention.

Semiconductor memory devices and methods of controlling the same according to a first to a fourth embodiment will be explained below with reference to the drawings.
First Embodiment FIG. 1 is a block diagram showing the configuration of a semiconductor memory device according to the first embodiment of the present invention. In a memory cell array 1, a plurality of memory cells for storing data are two-dimensionally arranged. Each memory cell is specified by selecting a word line WL and a column selecting signal line CLz. A column decoder 2 performs the selection of the column selecting line CLz. A row decoder 3 performs the selection of the word line WL. A read/write amplifier 4 can perform data read and write operations for each memory cell via data buses DB and /DB.

FIG. 2 shows a circuit in which a sense amplifier 17 and a precharge circuit 18 are connected to the aforementioned memory cell. The memory cell includes an n-channel MOS transistor (transfer gate) 20 and a capacitor element 21. The n-channel MOS transistor 20 has a gate connected to the word line WL, a drain connected to a bit line BL, and a source connected to a potential Vpr via the capacitor element 21. A cell node (storage node) CN is a node at a point of interface between the source of the transistor 20 and the capacitor element 21.

A bit line /BL is a logical inversion signal line of the bit line BL, and a bit line /BLs is a logical inversion signal line of a bit line BLs, and the data bus /DB is a logical inversion signal line of the data bus DB. The column selecting signal line CLz is connected to gates of n-channel MOS transistors (column gates) 11a and 11b. The transistor 11a has a drain connected to the data bus DB and a source connected to the bit line BLs. On the other hand, the transistor 11b has a drain connected to the data bus /DB and a source connected to the bit line /BLs. When the column selecting signal line CLz is changed to a high level, the transistors 11a and 11b are turned on. Then, the data bus DB is connected to the bit line BLs via the transistor 11a. Similarly, the data bus /DB is connected to the bit line /BLs via the transistor 11b. Namely, the bit lines BLs and /BLs are selected by changing the column selecting signal line CLz to the high level.

Gates of n-channel MOS transistors 19a and 19b are connected to an isolation signal line ISO. The transistor 19a can connect and cut off the bit line BLs to which the precharge circuit 18 and the sense amplifier 17 are connected and the bit line BL to which the transfer gate 20 and the capacitor element 21 are connected. Similarly, the transistor 19b can connect and cut off the bit lines /BL and /BLs.

When the transistors 19a and 19b are turned on and a precharge signal line PRE changes to a high level, the precharge circuit 18 causes a short circuit between the bit lines BL and BLs, and /BL and /BLs to precharge them at a predetermined potential Vpr. Moreover, when the transistors 19a and 19b are turned on and the precharge signal line PRE changes to a low level, the precharge circuit 18 opens the bit lines BL and BLs, and /BL and /BLs to each other.

The sense amplifier 17 has a CMOS inverter including a p-channel transistor 12 and an n-channel MOS transistor 13 and a CMOS inverter including a p-channel MOS transistor 14 and an n-channel MOS transistor 15.

The bit line BLs is connected to a point of interface between a gate of the transistor 14 and a gate of the transistor 15. A source of the transistor 14 is connected to a node PSA, and a source of the transistor 15 is connected to a node NSA. A point of interface between a drain of the transistor 14 and a drain of the transistor 15 is connected to the bit line /BLs.

Moreover, the bit line /BLs is connected to a point of interface between a gate of the transistor 12 and a gate of the transistor 13. A source of the transistor 12 is connected to the node PSA, and a source of the transistor 13 is connected to the node NSA. A point of interface between a drain of the transistor 12 and a drain of the transistor 13 is connected to the bit line BLs.

A p-channel MOS transistor Q1 has a gate connected to an overdrive signal line LEPx, a source connected to a first power source (high power source) Vdd, and a drain connected to the node PSA. A p-channel MOS transistor Q2 has a gate connected to a first sense amplifier activating signal line LEx, a source connected to a second power source (low power source) Vii, and a drain connected to the node PSA. The second power source Vii is a power source to supply a potential for maintaining data in the memory cell. The first power source Vdd is a power source higher than the second power source Vii.

An n-channel MOS transistor 16 has a gate connected to a second sense amplifier activating signal line LEz, a source connected to a potential Vss, and a drain connected to the node NSA. The potential Vss is at a ground level and lower than that of the second power source Vii.

The sense amplifier 17 inversely amplifies a signal of the bit line BLs and outputs it to the bit line /BLs, and inversely amplifies a signal of the bit line /BLs and outputs it to the bit line BLs. Namely, the sense amplifier 17 can perform a refresh operation in which the potential difference between the bit lines BL and BLs, and /BL and /BLs is amplified.

Figure 3:
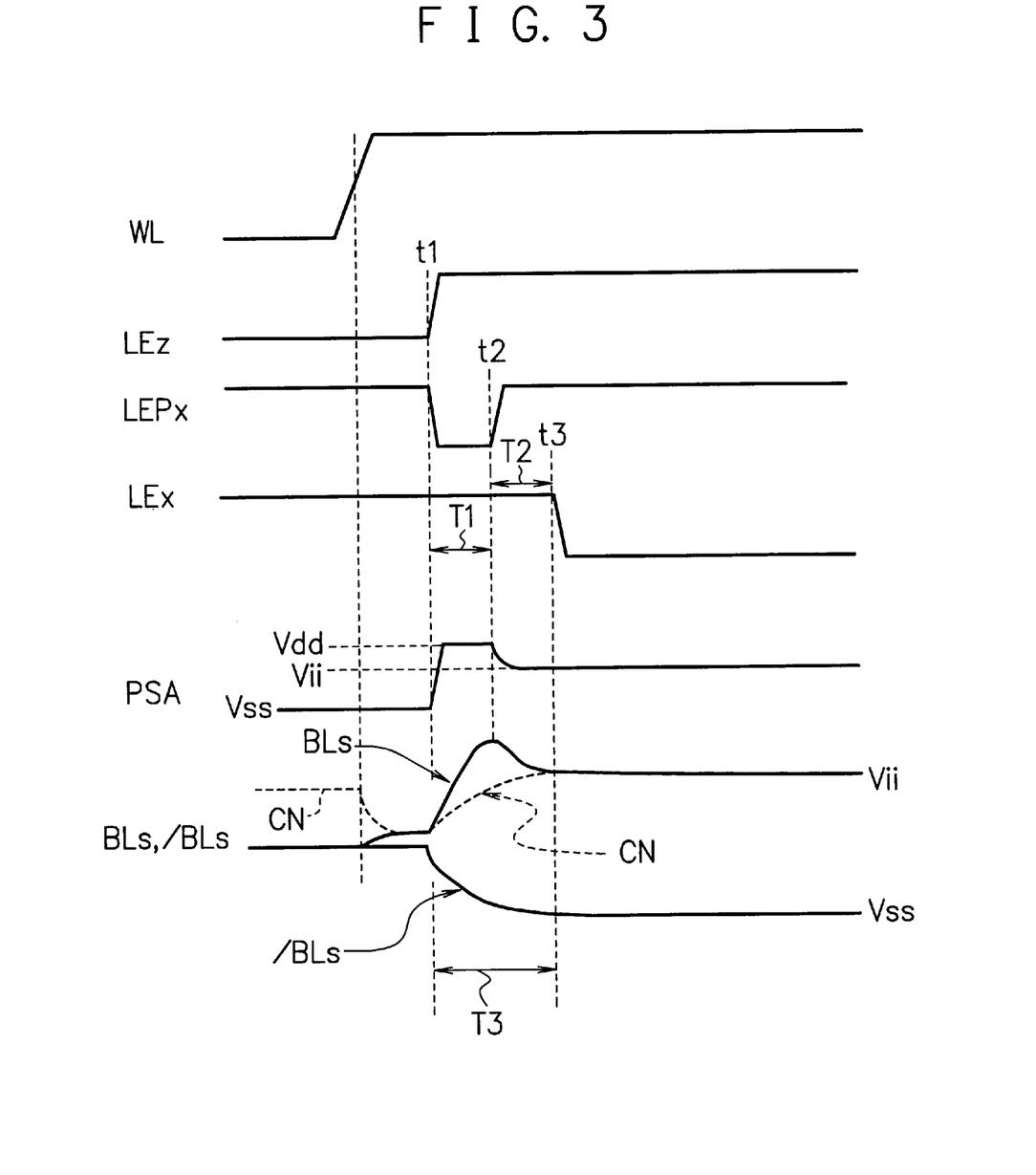
FIG. 3 is a timing chart for explaining the operation of the semiconductor memory device according to the first embodiment.

FIG. 3 is a timing chart for explaining the operation of the circuit in FIG. 2. First, as described above, the precharge circuit 18 causes a short circuit between the bit lines BL and BLs, and /BL and /BLs to precharge them at the predetermined potential Vpr.

The operation before a timing t1 will be explained. The second sense amplifier activating signal line LEz is at a low level, the transistor 16 is off, and the potential Vss and the node NSA are cut off from each other. The overdrive signal line LEPx is at a high level, the transistor Q1 is off, and the first power source Vdd and the node PSA are cut off from each other. The first sense amplifier activating signal line LEx is at a high level, the transistor Q2 is off, and the second power source Vii and the node PSA are cut off from each other.

When the word line WL is changed from a low level to a high level, the transfer gate 20 is turned on, and the capacitor element 21 is connected to the bit line BL. Then, a predetermined potential difference occurs between the bit lines BL and BLs, and /BL and /BLs. On this occasion, the transistors 19a and 19b are on.

Next, the operation at the timing t1 will be explained. By changing the second sense amplifier activating signal line LEz from the low level to a high level, the transistor 16 is turned on, and thereby the node NSA and the potential Vss are connected. By changing the overdrive signal line LEPx from the high level to a low level, the transistor Q1 is turned on, and thereby the node PSA and the first power source Vdd are connected. By maintaining the first sense amplifier activating signal line LEx at the high level, the transistor Q2 remains off, and the node PSA and the second power source Vii are cut off from each other. Namely, the node PSA is connected to the first power source Vdd, and the node NSA is connected to the potential Vss.

The logics of the bit lines BL and BLs, and /BL and /BLs are determined by data stored in the capacitor element 21. For example, a case where the data stored in the capacitor element 21 is at a high level will be explained. When the word line WL changes to a high level, the potential of the bit lines BL and BLs is raised since the capacitor element 21 and the bit line BL share electric charge. Accordingly, the bit line BLs goes closer to the first power source Vdd side than /BLs and the bit line /BLs goes closer to the potential Vss side than BLs, whereby the transistors 12 and 15 are turned on and the transistors 13 and 14 are turned off.

The first power source Vdd is connected to the bit line BLs, and hence the potential of the bit lines BL and BLs rises toward the potential of the first power source Vdd. On the other hand, the potential Vss is connected to the bit line /BLs, and hence the potential of the bit lines /BL and /BLs lowers toward the potential Vss. Namely, the sense amplifier 17 amplifies the potentials of the bit lines BL and BLs, and /BL and /BLs according to the first power source Vdd and the potential Vss.

Next, the operation at a timing t2 will be explained. By maintaining the second sense amplifier activating signal line LEz at the high level, the transistor 16 remains on, and the potential Vss is connected to the node NSA. By changing the overdrive signal line LEPx from the low level to the high level, the transistor Q1 is turned off, and the node PSA and the first power source Vdd are cut off from each other. By maintaining the first sense amplifier activating signal LEx at the high level, the transistor Q2 remains off, and the node PSA and the second power source Vii are cut off from each other. Namely, the node PSA is cut off from the first and second power sources Vdd and Vii and brought into an open state, and the node NSA is connected to the potential Vss. When the node PSA is brought into the open state, the bit line BLs is also brought into an open state, and hence the potential of bit line BL lowers by charging the cell and an end of the bit line. In a period T2 between timings t2 and t3, the bit line BLs can lower the potential, which has risen by the first power source Vdd, by charging the cell and the bit line end, and hence electric power is not consumed wastefully. On the other hand, the potential Vss remains connected to the node NSA, and therefore the potential of the bit lines /BL and /BLs changes toward the potential Vss.

The potential of the cell node CN after t1 changes following the potential of the bit line BLs. By prolonging a period T1 between the timings t1 and t2 in comparison with a case in FIG. 12, the potential of the bit line BLs can be made higher than the potential Vii. By raising the potential of the bit line BLs, the potential of the cell node CN can be raised at high speed.

Subsequently, a method of connecting the second power source Vii to the node PSA at the timing t2 is thought, but in this case, a current for extracting excess potential over the potential Vii of the bit line BLs by means of the power source Vii is a wasteful current, and hence power consumption unnecessarily increases.

In this embodiment, by cutting off the first and second power sources Vdd and Vii from the node PSA at the timing t2, the bit line BLs is brought into the open state, and consequently the potential of the bit line BLs can be lowered without wasteful electric power being consumed. A point in time when the potential of the bit line BL lowers and becomes equal to the potential of the second power source Vii is defined as the timing t3, at which the following control is performed.

Next, the operation at the timing t3 will be explained. The first sense amplifier activating signal line LEx is changed from the high level to a low level without the second sense amplifier activating signal line LEz and the overdrive signal line LEPx being changed. As a result, the second power source Vii is connected to the node PSA, and the potential Vss is connected to the node NSA. Immediately before the timing t3, the potential of the bit line BLs already becomes almost equal to the potential of the second power source Vii, and the potential of the bit line /BLs becomes almost equal to the potential Vss. By the aforementioned control at the timing t3, the potential of the bit lines BL and BLs is stabilized at the potential of the second power source Vii, and the potential of the bit lines /BL and /BLs is stabilized at the potential Vss. A period T3 between the timings t1 and t3 is a data amplification time.

The potential of the bit line BLs can be made higher than that of the second power source Vii by adjusting the length of the period T1 as stated above, and hence the data amplification time T3 can be shortened. Moreover, in the period T2, power consumption can be reduced by bringing the node PSA into the open state.

Figure 4:
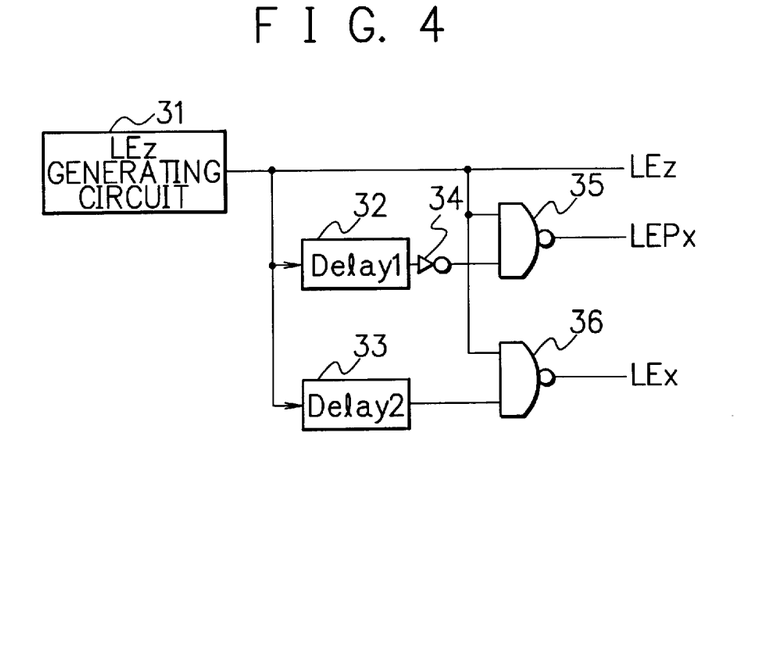
FIG. 4 is a circuit diagram of a sense amplifier control circuit according to the first embodiment.
Figure 5:
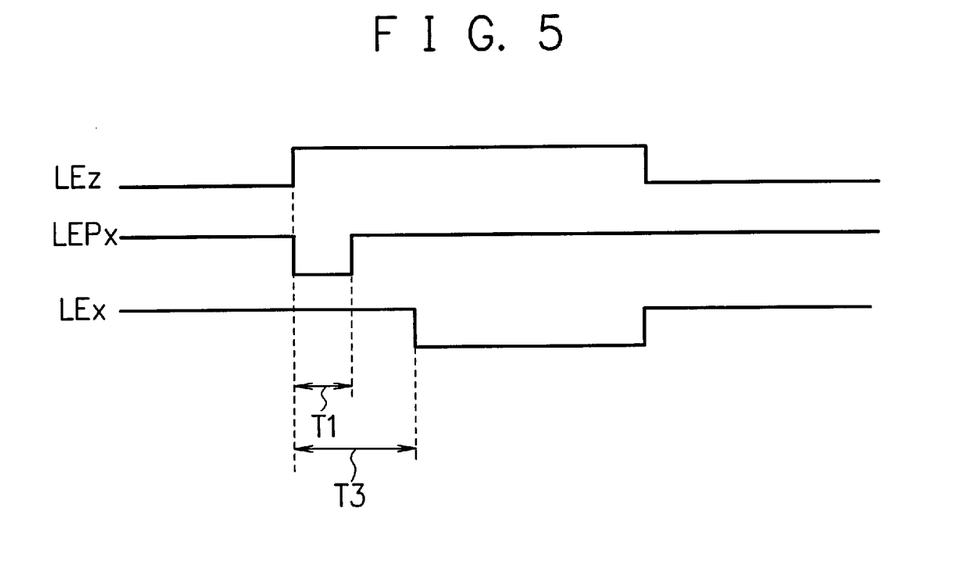
FIG. 5 is a timing chart for explaining the operation of the sense amplifier control circuit shown in FIG. 4.

FIG. 4 is a circuit diagram of a sense amplifier control circuit according to the first embodiment, and FIG. 5 is a timing chart for explaining the operation of the circuit. This sense amplifier control circuit is connected to the overdrive signal line LEPx, the first sense amplifier activating signal line LEx, and the second sense amplifier activating signal line LEz shown in FIG. 2.

An LEz generating circuit 31 generates a signal of the second sense amplifier activating signal line LEz shown in FIG. 5, and its output terminal is connected to the second sense amplifier activating signal line LEz. The output terminal of the LEz generating circuit 31 is connected to input terminals of delay elements 32 and 33. In a negative logical product (NAND) circuit 35, one input terminal is connected to the output terminal of the LEz generating circuit 31, the other input terminal is connected to an output terminal of the delay element 32 via a logical negation (NOT) circuit 34, and an output terminal is connected to the overdrive signal line LEPx. In a NAND circuit 36, one input terminal is connected to the output terminal of the LEz generating circuit 31, the other input terminal is connected to an output terminal of the delay element 33, and an output terminal is connected to the first sense amplifier activating signal line LEx. FIG. 5 shows signals of the signal lines LEz, LEPx, and LEx. The period T1 corresponds to a delay time of the delay element 32, and the period T3 corresponds to a delay time of the delay element 33.

As described above, according to the first embodiment, data amplification can be performed at high speed and with low power consumption by adjusting the signal timings of the signal lines LEx, LEz, and LEPx.

Second Embodiment

As concerns a semiconductor memory device according to the second embodiment of the present invention, in comparison with the first embodiment, only the sense amplifier control circuit shown in FIG. 4 is different, and the other points are the same.

Figure 6:
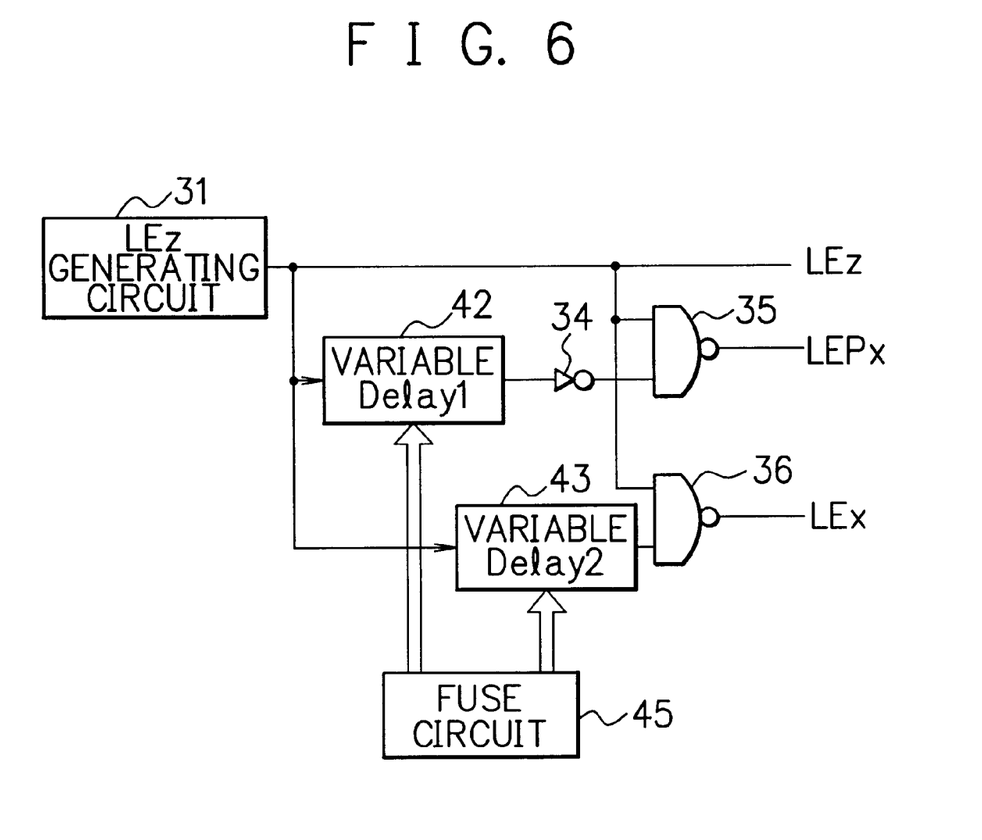
FIG. 6 is a circuit diagram of a sense amplifier control circuit according to a second embodiment of the present invention.

FIG. 6 is a circuit diagram of a sense amplifier control circuit according to the second embodiment. In this sense amplifier control circuit, variable delay elements 42 and 43 are provided in place of the delay elements 32 and 33 in the sense amplifier control circuit shown in FIG. 4, and a fuse circuit 45 is connected to the variable delay elements 42 and 43. By providing the variable delay elements 42 and 43, the delay time can be adjusted, and consequently even if there is manufacturing variability in semiconductor memory devices, refresh characteristics in the bit lines BLs and /BLs and the cell node CN shown in FIG. 3 can be made uniform.

The fuse circuit 45 can program delay times of the variable delay elements 42 and 43 independently. The variable delay elements 42 and 43 respectively delay signals according to the delay times programmed in the fuse circuit 45. The fuse circuit 45 can program the delay time in semiconductor wafer test and so on. Incidentally, programming may be performed by a latch circuit or the like in place of the fuse circuit 45.

Figure 7:
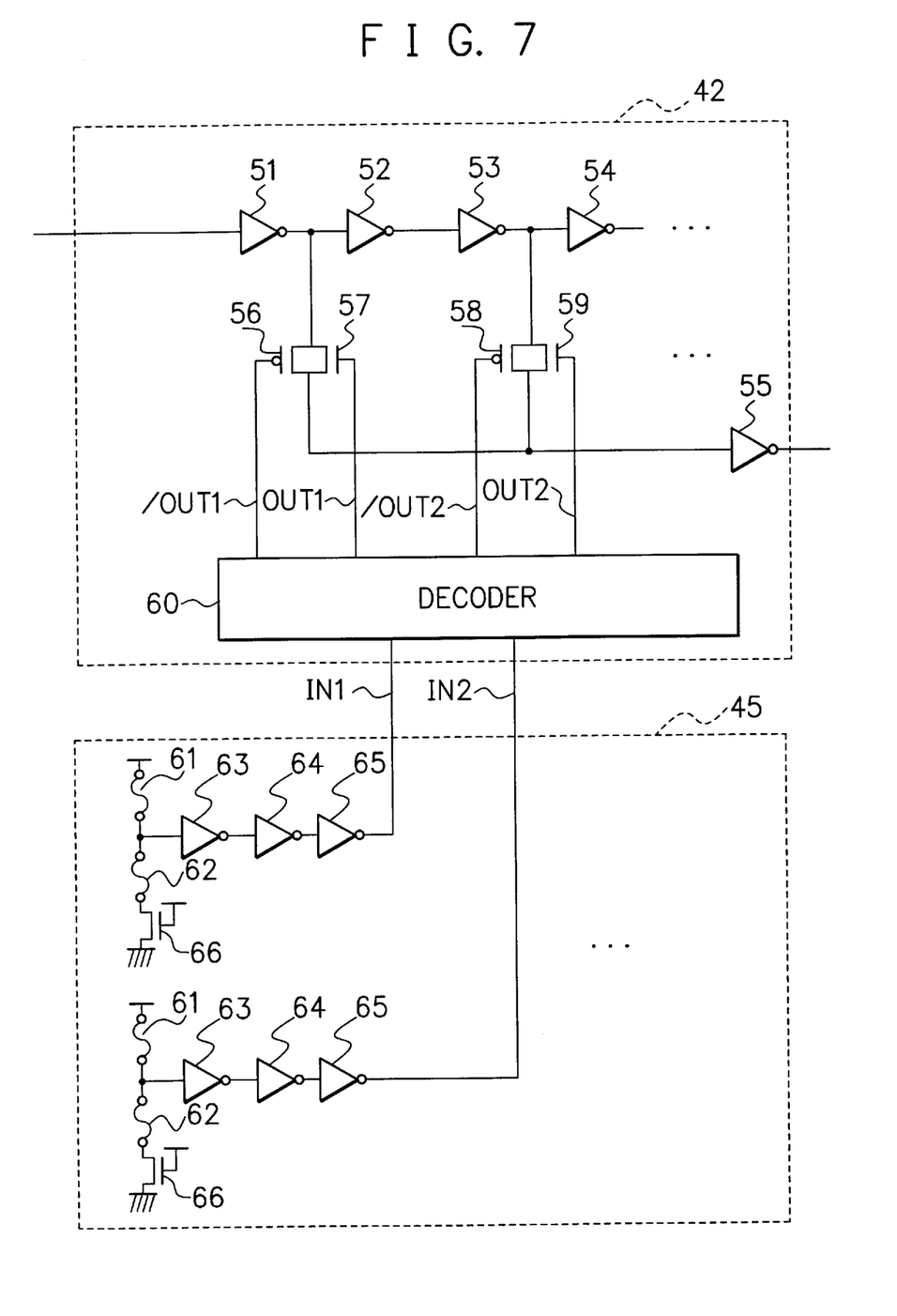
FIG. 7 is a circuit diagram of a variable delay element and a fuse circuit shown in FIG. 6.

FIG. 7 is a circuit diagram of the variable delay element 42 and the fuse circuit 45 shown in FIG. 6. The circuit of the variable delay element 43 is also the same as that of the variable delay element 42. First, the configuration of the variable delay element 42 will be explained. In the variable delay element 42, an input terminal corresponds to an input terminal of a NOT circuit 51, and an output terminal corresponds to an output terminal of a NOT circuit 55. A plurality of NOT circuits 51, 52, 53, 54, and so on are connected in series.

A p-channel MOS transistor 56 has a gate connected to an output line /OUT1, a source connected to a point of interface between the NOT circuits 51 and 52, and a drain connected to an input terminal of the NOT circuit 55. An n-channel MOS transistor 57 has a gate connected to an output line OUT1, a drain connected to the point of interface between the NOT circuits 51 and 52, and a source connected to the input terminal of the NOT circuit 55.

Similarly, a p-channel MOS transistor 58 has a gate connected to an output line /OUT2, a source connected to a point of interface between the NOT circuits 53 and 54, and a drain connected to the input terminal of the NOT circuit 55. An n-channel MOS transistor 59 has a gate connected to an output line OUT2, a drain connected to the point of interface between the NOT circuits 53 and 54, and a source connected to the input terminal of the NOT circuit 55. Likewise, plural pairs of CMOS transistors described above are provided.

For example, in order to shorten the delay time when the output signal line OUT1 is at a low level and the output signal line OUT2 is at a high level, it is required to change the output signal line OUT1 to a high level and change the output signal line OUT 2 to a low level. The output signal lines /OUT1 and /OUT 2 are logical inversion signals of the output signal lines OUT1 and OUT2 respectively. In this case, the transistors 56 and 57 are turned on, and the transistors 58 and 59 are turned off. As a result, a signal inputted to the variable delay element 42 is outputted through the NOT circuit 51, the transistors 56 and 57, and the NOT circuit 55. Namely, the delay time is shortened by a time corresponding to two NOT circuits.

For example, in order to prolong the delay time when the output signal line OUT1 is at the high level and the output signal line OUT2 is at the low level, it is required to change the output signal line OUT1 to the low level and change the output signal line OUT 2 to the high level. In this case, the transistors 56 and 57 are turned off, and the transistors 58 and 59 are turned on. As a result, a signal inputted to the variable delay element 42 is outputted through the NOT circuits 51, 52, and 53, the transistors 58 and 59, and the NOT circuit 55. Namely, the delay time is prolonged by a time, corresponding to two NOT circuits. As described above, the delay time is determined by the output signal lines OUT1, /OUT1, OUT2, /OUT2, and so on.

A decoder 60 determines signal levels on the output signal lines OUT1, /OUT1, OUT2, /OUT2, and so on according to signal inputs from input signal lines IN1, IN2, and so on.

Next, the configuration of the fuse circuit 45 will be explained. A fuse 61 is connected to a power source terminal and an input terminal of a NOT circuit 63. A fuse 62 is connected to the input terminal of the NOT circuit 63 and a drain of an n-channel MOS transistor 66. The n-channel MOS transistor 66 has a gate connected to a power source terminal, a source connected to a ground terminal, and a drain connected to the fuse 62. A point of interface between the fuses 61 and 62 is connected to the input signal line IN1, IN2, or the like through three NOT circuits 63, 64, and 65. Plural sets of elements described above are provided according to the delay time of the variable delay element 42. The fuses 61 and 62 of the fuse circuit 45 can program the delay time by blowing out either of them, for example, at the time of semiconductor wafer test.

As described above, according to the second embodiment, by adjusting the delay time of the variable delay element, data amplification characteristics and refresh characteristics can be made uniform even if there is manufacturing variability in semiconductor memory devices.

Third Embodiment

As concerns a semiconductor memory device according to the third embodiment of the present invention, in comparison with the first embodiment, only the sense amplifier control circuit shown in FIG. 4 is different, and the other points are the same.

Figure 8:
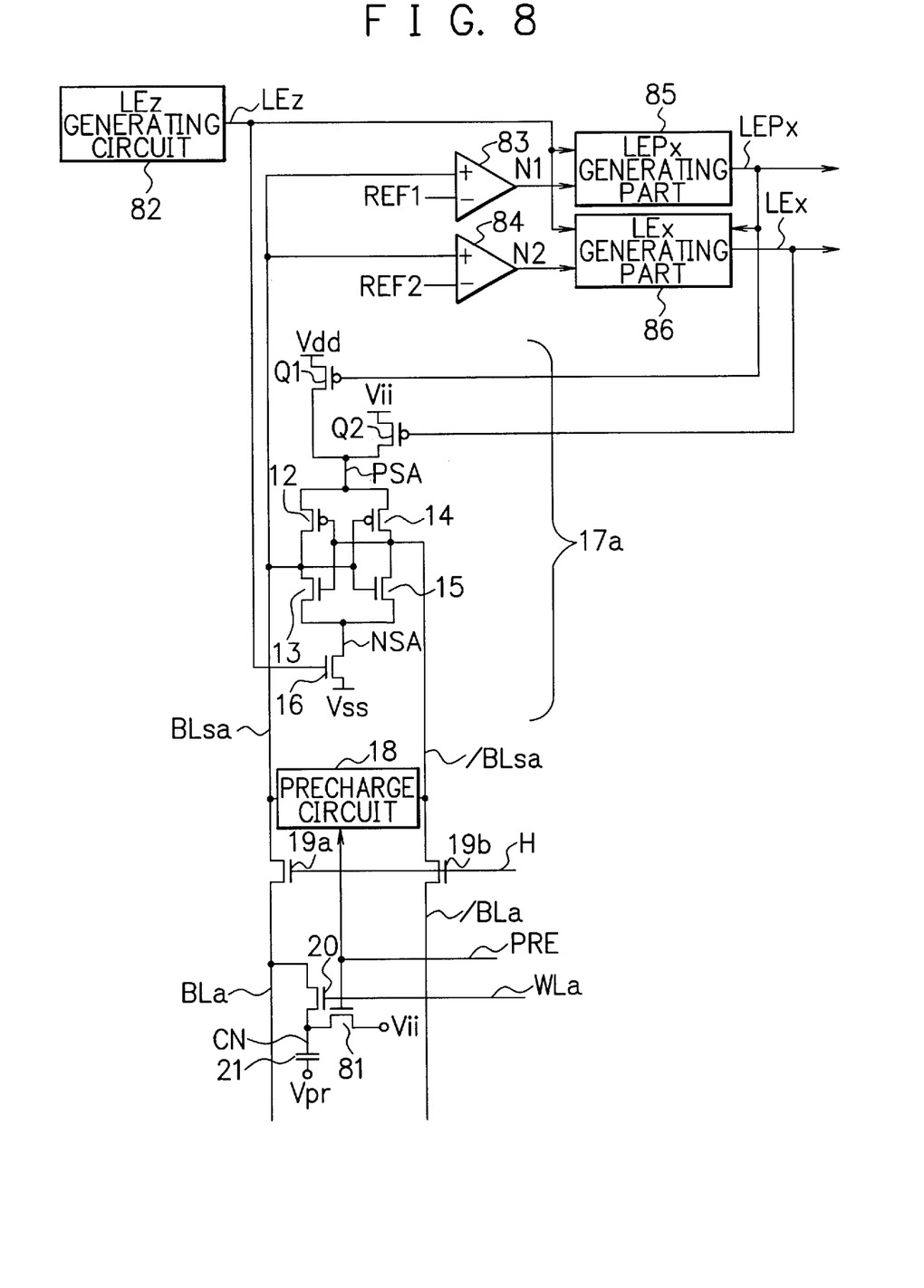
FIG. 8 is a circuit diagram of a sense amplifier control circuit according to a third embodiment of the present invention.

FIG. 8 is a circuit diagram of a sense amplifier control circuit according to the third embodiment. This sense amplifier control circuit is provided with a dummy sense amplifier 17a, a dummy memory cell, and the like, detects the signal level of a dummy bit line BLsa, and generates signals on the signal lines LEx, LEz, and LEPx according to the detected result. Thereby, the timings of signals can be controlled dynamically, and hence even when operating environment such a temperature changes, uniform data amplification characteristics and refresh characteristics can be provided.

The dummy sense amplifier 17a has the same configuration as the sense amplifier 17 shown in FIG. 2, and it is connected to dummy bit lines BLa, BLsa, /BLa, and /BLsa. The precharge circuit 18 and the transistors 19a and 19b are connected to the dummy bit lines BLa, BLsa, /BLa, and /BLsa in the same manner as in FIG. 2. However, a high level is always supplied to the gates of the transistors 19a and 19b. The dummy memory cell includes the transfer gate 20 and the capacitor element 21 in the same manner as in FIG. 2. The gate of the transfer gate 20 is connected to a dummy word line WLa.

Here, an n-channel MOS transistor 81 is newly provided. The transistor 81 has a gate connected to the precharge signal line PRE, a source connected to the cell node CN, and a drain connected to the potential Vii. When the precharge signal line PRE is changed to a high level, the transistor 81 is turned on, and the capacitor element 21 can be charged at the potential Vii, and hence a logical value stored in the capacitor element 21 can be fixed.

An output terminal of an LEz generating circuit 82 is connected to the second sense amplifier activating line LEz. In a comparator 83, a plus terminal is connected to the dummy bit line BLsa, and a minus terminal is connected to a first reference potential REF1. In a comparator 84, a plus terminal is connected to the dummy bit line BLsa, and a minus terminal is connected to a second reference potential REF2.

In an LEPx generating part 85, an input terminal is connected to the signal line LEz and an output node N1 of the comparator 83, and an output terminal is connected to the signal line LEPx. In an LEx generating part 86, an input terminal is connected to the signal lines LEz and LEPx and an output node N2 of the comparator 84, and an output terminal is connected to the signal line LEx.

Figure 9:
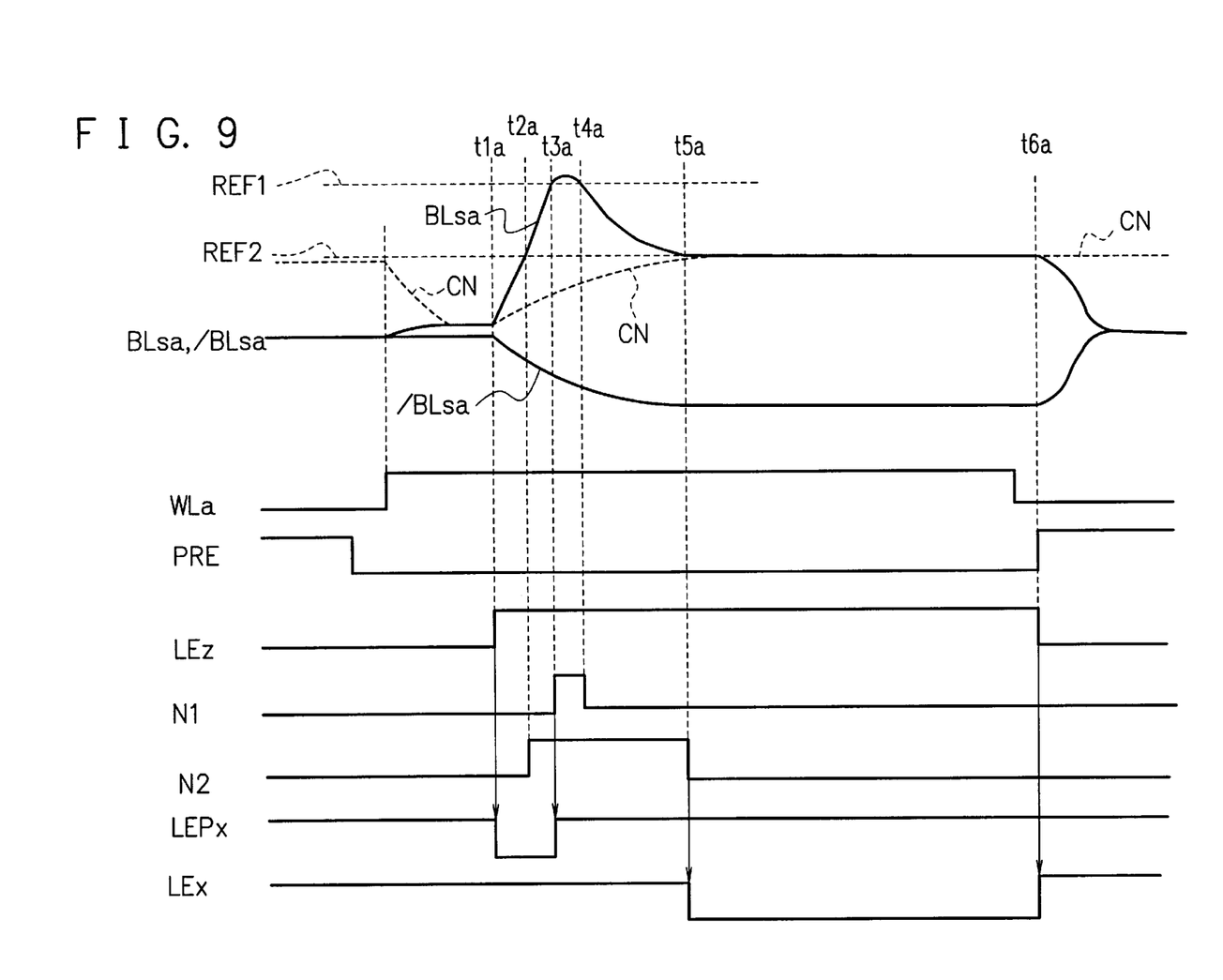
FIG. 9 is a timing chart for explaining the operation of the sense amplifier control circuit shown in FIG. 8.

FIG. 9 is a timing chart for explaining the operation of the sense amplifier control circuit shown in FIG. 8. The operation before a timing t1a is the same as that before the timing t1 in the timing chart shown in FIG. 3. The first reference potential REF1 is higher than the second reference potential REF2.

First, the operation between timings t1a and t2a will be explained. Since the potential of the dummy bit line BLsa is lower than the first reference potential REF1, the output node N1 of the comparator 83 is at a low level. Also, since the potential of the dummy bit line BLsa is lower than the second reference potential REF2, the output node N2 of the comparator 84 is at a low level.

Next, the operation between timings t2a and t3a will be explained. Since the potential of the dummy bit line BLsa is lower than the first reference potential REF1, the output node N1 of the comparator 83 is at the low level. Also, since the potential of the dummy bit line BLsa is higher than the second reference potential REF2, the output node N2 of the comparator 84 is at a high level.

Next, the operation between timings t3a and t4a will be explained. Since the potential of the dummy bit line BLsa is higher than the first reference potential REF1 and the second reference potential REF2, the output node N1 of the comparator 83 and the output node N2 of the comparator 84 are at high levels.

Next, the operation between timings t4a and t5a will be explained. Since the potential of the dummy bit line BLsa is lower than the first reference potential REF1 and higher than the second reference potential REF2, the output node N1 of the comparator 83 is at a the low level, and the output node N2 of the comparator 84 is at the high level.

Next, the operation after the timing t5a will be explained. Since the potential of the dummy bit line BLsa is lower than the first reference potential REF1 and the second reference potential REF2, the output node N1 of the comparator 83 and the output node N2 of the comparator 84 are at the low levels.

At a timing t6a, the precharge signal line PRE changes from a low level to a high level, and the signal line LEz changes from a high level to a low level. When the precharge signal line PRE changes to the high level, the dummy bit lines BLa, BLsa, /BLa, and /BLsa are short-circuited to be precharged at the predetermined potential Vpr.

The LEz generating circuit 82 generates a signal of the signal line LEz shown in FIG. 9. The LEPx generating part 85 generates a signal of the signal line LEPx in response to signals of the signal line LEz and the output node N1. The LEx generating part 86 generates a signal of the signal line LEx in response to signals of the signal line LEz and the output node N2. The potential of the cell node CN between the timings t1a and t6a changes following the potential of the dummy bit line BLsa.

When the timings are changed here due to the securement of a margin for manufacturing variability, temperature, and a power source, the influence of circuit or wiring delay, or the like, it is recommended to change the levels of the reference potentials REF1 and REF2 or apply dummy loads to the bit lines BLa, BLsa, /BLa, and /BLsa by CMOS capacitance and the like.

As described above, according to the third embodiment, by providing the dummy memory cell, the dummy sense amplifier 17a, and the like in addition to the memory cell and the sense amplifier 17 shown in FIG. 2, the signal timings of the signal lines LEz, LEPx and LEx can be controlled dynamically while detecting data amplification characteristics (refresh characteristics) in real time. Consequently, even if there is manufacturing variability, and operating environment such as temperature and a power source changes, high-precision and uniform data amplification characteristics and refresh characteristics can be provided.

Fourth Embodiment

Figure 10:
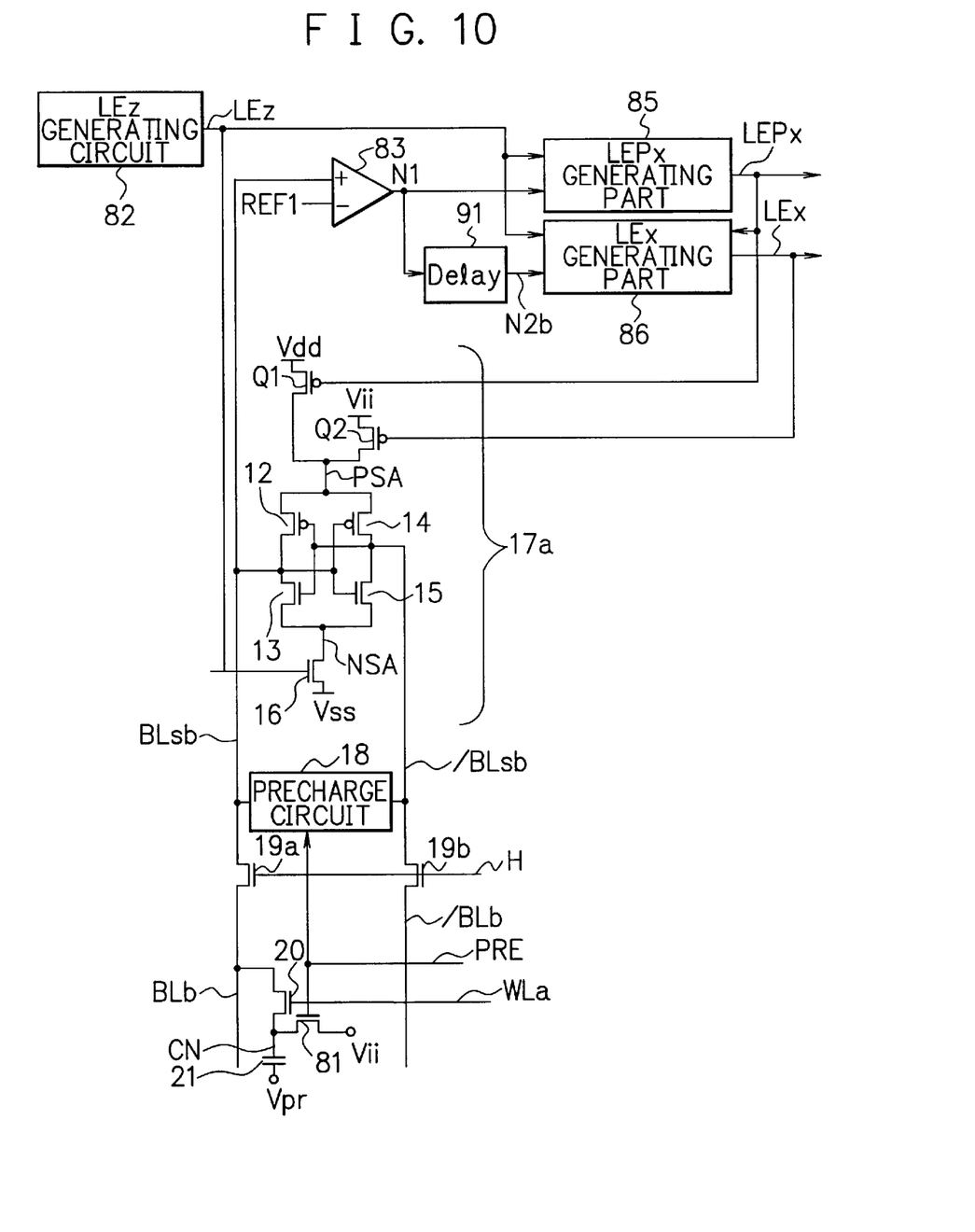
FIG. 10 is a circuit diagram of a sense amplifier control circuit according to a fourth embodiment of the present invention.

As concerns a semiconductor memory device according to the fourth embodiment of the present invention, in comparison with the third embodiment, only the sense amplifier control circuit shown in FIG. 8 is different, and the other points are the same. In FIG. 10, a circuit diagram of a sense amplifier control circuit according to the fourth embodiment is shown. In this sense amplifier control circuit, a delay element 91 (FIG. 10) is provided in place of the comparator 84 shown in FIG. 8. In the delay element 91, an input terminal is connected to the output node N1 of the comparator 83, and an output terminal is connected to the input terminal of the LEx generating part 86 via an output node N2b.

Figure 11:
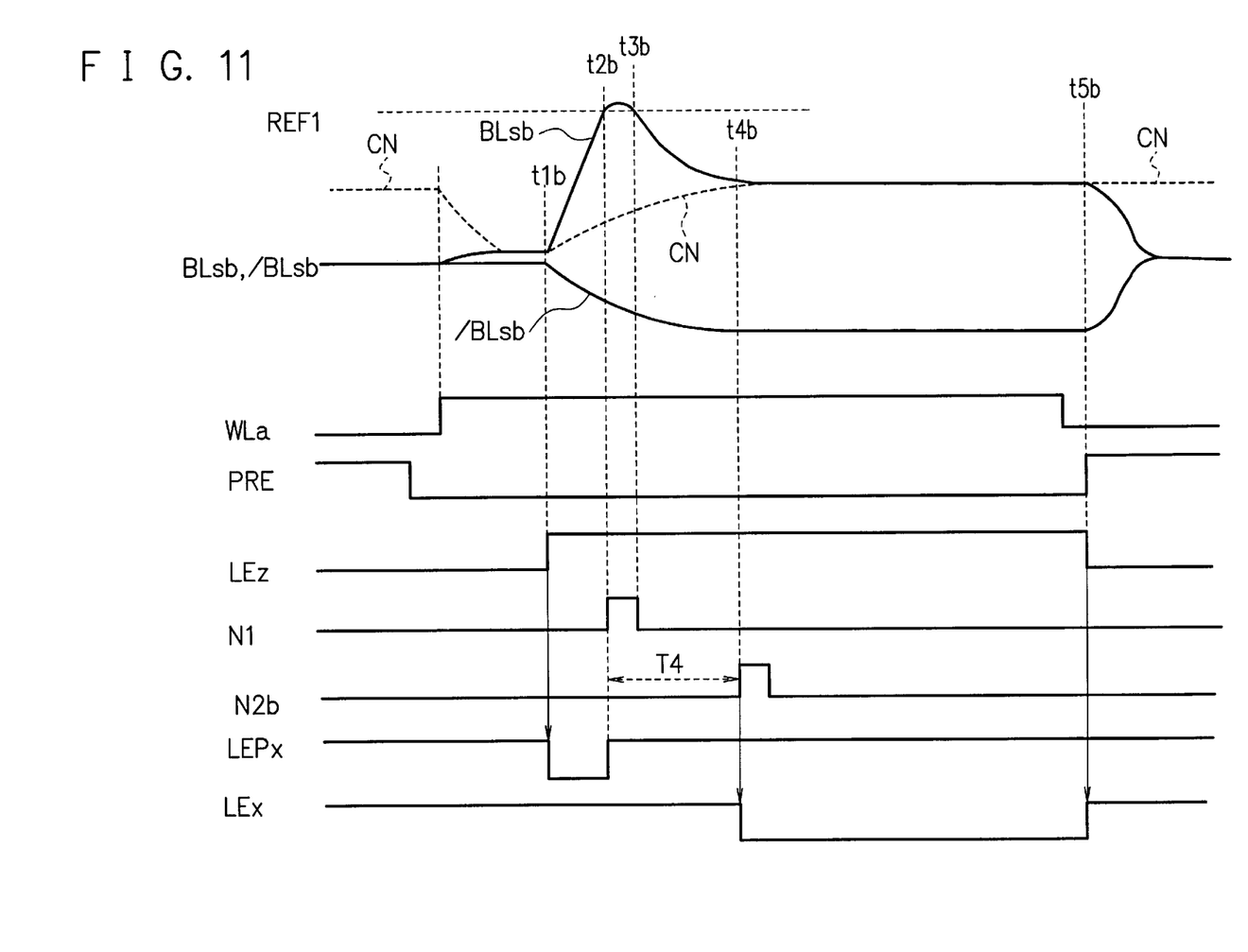
FIG. 11 is a timing chart for explaining the operation of the sense amplifier control circuit shown in FIG. 10.

FIG. 11 is a timing chart for explaining the operation of the sense amplifier control circuit shown in FIG. 10.

Between timings t1b and t2b, the potential of a dummy bit line BLsb is lower than the first reference potential REF1, whereby the output node N1 of the comparator 83 is at a low level.

Between timings t2b and t3b, the potential of the dummy bit line BLsb is higher than the first reference potential REF1, whereby the output node N1 of the comparator 83 is at a high level.

After the timing t3b, the potential of the dummy bit line BLsb is lower than the first reference potential REF1, whereby the output node N1 of the comparator 83 is at the low level.

A signal of the output node N2b of the delay element 91 is a signal which is later than a signal of the node N1 by a delay time T4.

Similarly to the third embodiment, the LEz generating circuit 82 generates a signal of the signal line LEz shown in FIG. 11. The LEPx generating part 85 generates a signal of the signal line LEPx in response to signals of the signal line LEz and the node N1. The LEx generating part 86 generates a signal of the signal line LEx in response to signals of the signal line LEz and the node N2b.

When the timings are changed here due to the securement of a margin for manufacturing variability, temperature, and a power source, the influence of circuit or wiring delay, or the like, it is recommended to change the level of the reference potentials REF1 or apply dummy loads to the bit lines BLb, BLsb, /BLb, and /BLsb by CMOS capacitance and the like.

Moreover, at a timing t4b when the node N2b changes to a high level, the potential changes of dummy bit lines BLsb and /BLsb are gradual, and hence the signal timing of the node N2 needs not be as precise as the signal timing of the node N1. Accordingly, it is desirable that the delay element 91 be a variable delay element, but a fixed delay element also presents no problem.

As described above, according to the first to fourth embodiments, by connecting the first power source Vdd to the node PSA between the timings t1 and t2 shown in FIG. 3 and making the potential of the bit line BLs higher than the second power source Vii, the data amplification time T3 can be shortened. Then, by bringing the node PSA into an open state between the timings t2 and t3, the potential of the bit line BLs can be lowered without wasteful electric power being consumed. Thereafter, by connecting the second power source Vii to the node PSA after the timing t3, the potential of the bit lines BL and BLs can be stabilized at the potential of the power source Vii.

According to the second embodiment, by using the variable delay element in the sense amplifier control circuit, the timings of the signal lines LEx, LEz, and LEPx inputted to the sense amplifier can be adjusted, and consequently variations in data amplification characteristics and refresh characteristics due to manufacturing variability can be prevented.

According to the third and fourth embodiments, the dummy sense amplifier, the dummy memory cell, and the like are provided, their data amplification operations are detected in real time, and thereby the timings of the signal lines Lex, Lez, and LEPx can be adjusted dynamically, whereby variations in data amplification characteristics and refresh characteristics due to changes in operating environment such as temperature and a power source in addition to manufacturing variability can be prevented.

The refresh operation of the semiconductor memory device is explained above. The speed of the refresh operation can be increased by shortening the data amplification time of the sense amplifier.

The data read speed is also increased by shortening the data amplification time. Referring to FIG. 2, the read operation of the semiconductor memory device will be explained. The transistor 20 is turned on by changing the word line WL to a high level. At this time, the isolation signal ISO is at a high level, and the transistors 19a and 19b are on. Electric charge in the capacitor element 21 is extracted to the bit lines BL and BLs and amplified by the sense amplifier 17. Thereafter, the column selecting signal line CLz is changed to a high level, and thereby the transistors 11a and 11b are turned on, the potential of the bit line BLs is read out to the data bus DB via the transistor 11a, and the potential of the bit line /BLs is read out to the data bus /DB via the transistor 11b. Since the data amplification speed of the sense amplifier 17 is increased, the data read speed of the semiconductor memory device is also increased.

It should be noted that the present embodiments are to be considered in all respects as illustrative and not restrictive, and all changes which come within the meaning and range of equivalency of the claims are therefore intended to be embraced therein. The invention may be embodied in other specific forms without departing from the spirit or essential characteristics thereof.

INDUSTRIAL APPLICABILITY

As described above, according to the present invention, by supplying a first high power source to a sense amplifier in a first step, the potential of a bit line connected to an output of the sense amplifier can be made higher than the potential of a second low power source, and hence data in a memory cell can be amplified at high speed. Then, by not supplying either the first power source or the second power source to the sense amplifier in a second step, the potential of the bit line, which is made higher than the potential of the second low power source, can be lowered by charging a cell and an end of the bit line, and hence power consumption can be reduced without electric power being consumed wastefully since the potential is not extracted by the second low power source. Thereafter, by supplying the second low power source to the sense amplifier in a third step, the memory cell can be stabilized at a predetermined maintenance potential. Since the sense amplifier can perform data amplification at high speed, the speed of the refresh operation and the data read speed of a semiconductor memory device can be increased. Moreover, variations in refresh operation, data read operation, and so on according to manufacturing variability and changes in operating environment can be prevented.

What is claimed is:

1. A semiconductor memory device, comprising:
   a memory cell array in which a plurality of memory cells for storing data are arranged;
   a sense amplifier for amplifying the data in said memory cell;
   a first power source;
   a second power source lower than said first power source; and
   a control circuit for performing control in such a manner that said sense amplifier receives power supply from said first power source to amplify the data in said memory cell in a first step, does not receive power supply either from said first power source or from said second power source in a second step, and receives power supply from said second power source to amplify the data in said memory cell in a third step.

2. The semiconductor memory device according to claim 1, further comprising:
   a power supply line for providing power supply to said sense amplifier from said first or second power source,
   said control circuit performing control in such a manner that said first power source is connected to said sense amplifier via said power supply line in said first step, said first and second power sources are cut off from said sense amplifier in said second step, and that said second power source is connected to said sense amplifier via said power supply line in said third step.

3. The semiconductor memory device according to claim 1, further comprising:

a bit line for connecting an output of said sense amplifier and said memory cell, said control circuit performing control in such a manner that electric charge is charged so that the potential of said bit line becomes higher than said second power source.

4. The semiconductor memory device according to claim 3, wherein said memory cell includes a capacitor element for storing the data by accumulating electric charge, and wherein said control circuit performs control in such a manner that the amount of electric charge is increased by charging electric charge to said capacitor element in said memory cell from said sense amplifier via said bit line in said second step.

5. The semiconductor memory device according to claim 4, wherein said control circuit performs control in such a manner that sufficient electric charge to perform refresh is accumulated in said capacitor element in said memory cell at a point in time when said third step is started.

6. The semiconductor memory device according to claim 4, wherein said control circuit performs control in such a manner that the potential of said capacitor element in said memory cell and/or the potential of said bit line becomes equal to said second power source at a point in time when said third step is started.

7. The semiconductor memory device according to claim 1, wherein said control circuit includes a delay element for determining the length of the period of said first step and/or the period of said second step.

8. The semiconductor memory device according to claim 1, wherein said control circuit includes a variable delay element capable of changing the length of the period of said first step and/or the period of said second step.

9. The semiconductor memory device according to claim 8, wherein the delay time of said variable delay element is programmable.

10. The semiconductor memory device according to claim 1, wherein said control circuit includes a detection circuit for detecting the state of said sense amplifier and controls the length of the period of said first step and/or the period of said second step according to a result detected by said detection circuit.

11. The semiconductor memory device according to claim 10, further comprising:

a dummy sense amplifier and a dummy memory cell for being used as dummies, wherein said detection circuit detects the state of said dummy sense amplifier.

12. The semiconductor memory device according to claim 11, wherein said control circuit includes a first comparator for comparing an output of said dummy sense amplifier and a first reference voltage and a second comparator for comparing the output of said dummy sense amplifier and a second reference voltage, and performs control according to comparison results by said first and second comparators.

13. The semiconductor memory device according to claim 11, wherein said control circuit includes a comparator for comparing an output of said dummy sense amplifier and a reference voltage and a delay element for delaying an output of said comparator and performs control according to the output of said comparator and an output of said delay element.

14. A method of controlling a semiconductor memory device comprising a memory cell array in which a plurality of memory cells for storing data are arranged, a sense amplifier for amplifying the data in said memory cell, a first power source, and a second power source lower than said first power source, comprising:

a first step in which said sense amplifier receives power supply from said first power source to amplify the data in said memory cell;

a second step in which said sense amplifier does not receive power supply either from said first power source or from said second power source; and a third step in which said sense amplifier receives power supply from said second power source to amplify the data in said memory cell.

15. The method of controlling the semiconductor memory device according to claim 14, wherein said semiconductor memory device further comprises a bit line for connecting an output of said sense amplifier and said memory cell, and wherein in said first step, electric charge is charged so that the potential of said bit line becomes higher than said second power source.

16. The method of controlling the semiconductor memory device according to claim 15, wherein said memory cell includes a capacitor element for storing data by accumulating electric charge, and wherein a point in time when said third step is started is a point in time when sufficient electric charge to perform refresh is accumulated in said capacitor element in said memory cell.

17. The method of controlling the semiconductor memory device according to claim 15, wherein said memory cell includes a capacitor element for storing data by accumulating electric charge, and wherein a point in time when said third step is started is a point in time when the potential of said capacitor element in said memory cell and/or the potential of said bit line becomes equal to said second power source.

* * * * *